(12) United States Patent
Chung et al.

(10) Patent No.: US 8,563,130 B2
(45) Date of Patent: Oct. 22, 2013

(54) ANTI-REFLECTIVE COATINGS

(75) Inventors: Chao Jen Chung, North Wales, PA (US); Edward E. Lafleur, Holland, PA (US); Edwin Nungesser, Horsham, PA (US); Edward C. Greer, Lower Gwynedd, PA (US)

(73) Assignee: Rohm and Haas Company, Philadelphia, PA (US)

( * ) Notice: Subject to any disclaimer, the term of this patent is extended or adjusted under 35 U.S.C. 154(b) by 128 days.

(21) Appl. No.: 13/237,442

(22) Filed: Sep. 20, 2011

(65) Prior Publication Data

US 2012/0070656 A1 Mar. 22, 2012

Related U.S. Application Data

(60) Provisional application No. 61/384,786, filed on Sep. 21, 2010.

(51) Int. Cl.
*G02B 5/26* (2006.01)
*B32B 27/20* (2006.01)
*B82Y 30/00* (2011.01)

(52) U.S. Cl.
USPC .......................... 428/338; 252/582; 977/779

(58) Field of Classification Search
USPC .......................... 252/582; 428/338; 977/779
See application file for complete search history.

(56) References Cited

U.S. PATENT DOCUMENTS

| 4,501,470 | A |   | 2/1985 | Yeh |   |
|---|---|---|---|---|---|
| 7,214,421 | B2 | * | 5/2007 | Leyrer et al. | ............ 428/323 |
| 7,655,298 | B2 |   | 2/2010 | Thies et al. |   |
| 7,682,530 | B2 | * | 3/2010 | Purdy et al. | ............ 252/586 |
| 7,768,602 | B2 |   | 8/2010 | LaFleur et al. |   |
| 2006/0182968 | A1 |   | 8/2006 | Yoshida et al. |   |
| 2007/0218291 | A1 |   | 9/2007 | Chiou et al. |   |
| 2009/0097123 | A1 |   | 4/2009 | LaFleur et al. |   |
| 2010/0015433 | A1 |   | 1/2010 | Arfsten et al. |   |

FOREIGN PATENT DOCUMENTS

| EP | 2343579 | 7/2011 |
| JP | 2009280693 | 3/2009 |
| JP | 2010128180 A | 6/2010 |
| JP | 2010150491 A | 7/2010 |

* cited by examiner

*Primary Examiner* — Satya Sastri
*(74) Attorney, Agent, or Firm* — Kenneth Crimaldi

(57) ABSTRACT

A composition comprising polymeric particles having an average particle diameter from 0.5 to 30 μm and Vicker's scale hardness from 100 to 700 Kgf/mm². The composition also contains a film-forming polymer having $T_g$ no greater than 80° C. The average refractive index difference measured from 400 nm to 1100 nm between the polymeric particles and the film-forming polymer is no greater than 0.04.

10 Claims, No Drawings

ANTI-REFLECTIVE COATINGS

This invention relates to compositions which can be used to form anti-reflective coatings which are particularly useful for construction of photovoltaic modules.

Optical filters for selection of a portion of the spectrum are well known. For example, U.S. Pat. No. 4,501,470 discloses an optical bandpass filter for this purpose. However, this filter requires a series of layers of varying composition and refractive index.

The problem addressed by the present invention is to provide a coating which can be used to form an anti-reflective film which is particularly useful for construction of photovoltaic modules.

STATEMENT OF INVENTION

The present invention provides a composition comprising polymeric particles having: (a) an average particle diameter from 0.5 to 30 µm; and (b) a Vicker's scale hardness from 100 to 700 Kgf/mm$^2$; and a film-forming polymer having $T_g$ no greater than 80° C.; wherein an average refractive index difference measured from 400 nm to 1100 nm between the polymeric particles and the film-forming polymer is no greater than 0.04, and an average refractive index difference measured above 1100 nm or below 400 nm between the polymeric particles and the film-forming polymer is at least 0.04.

The present invention is further directed to a film comprising polymeric particles having: (a) an average particle diameter from 0.5 to 30 µm; and (b) a Vicker's scale hardness from 100 to 700 Kgf/mm$^2$; and a continuous polymeric phase having $T_g$ no greater than 80° C.; wherein an average refractive index difference measured from 400 nm to 1100 nm between the polymeric particles and the continuous polymeric phase is no greater than 0.04, and an average refractive index difference measured above 1100 nm or below 400 nm between the polymeric particles and the continuous polymeric phase is at least 0.04; and wherein an average distance between the polymeric particles is from 0.85 to 30 µm.

The present invention is further directed to a composition comprising: (a) polymeric particles having (i) an average particle diameter from 0.5 to 30 µm, (ii) a Vicker's scale hardness from 100 to 700 Kgf/mm$^2$, and (iii) at least 2.5 wt % polymerized residues of crosslinkers; (b) a non-aqueous solvent having a boiling point no greater than 140° C.; and (c) a film-forming polymer; wherein an average refractive index difference measured from 400 nm to 1100 nm between the polymeric particles and the film-forming polymer is no greater than 0.04, and an average refractive index difference measured above 1100 nm or below 400 nm between the polymeric particles and the film-forming polymer is at least 0.04.

DETAILED DESCRIPTION

Percentages are weight percentages (wt %) and temperatures are in ° C., unless specified otherwise. RI values are determined at the sodium D line, where λ=589.29 nm at 20° C., unless specified otherwise. A "non-aqueous" solvent is one which is substantially free of water, i.e., having less than 0.3% water, preferably less than 0.2%, preferably less than 0.1%, preferably less than 0.05%, preferably less than 0.02%. Boiling points are measured at atmospheric pressure, i.e., 101 kPa. Polymeric particles comprise organic polymers, preferably addition polymers, and preferably are substantially spherical. Average particle diameter is determined as the arithmetic mean particle diameter. $T_g$ values are calculated from homopolymer $T_g$ values using the Fox equation; see *Bulletin of the American Physical Society* 1, 3, page 123 (1956). The $T_g$ of a polymeric particle whose composition varies throughout the particle is the weight average of the $T_g$ values of the different compositions in the particle. Weight percentages of monomers are calculated for each stage of a multistage polymer based on the total weight of monomers added to the polymerization mixture in that stage. As used herein the term "(meth)acrylic" refers to acrylic or methacrylic, and "(meth)acrylate" refers to acrylate or methacrylate. The term "(meth)acrylamide" refers to acrylamide (AM) or methacrylamide (MAM). "Acrylic monomers" include acrylic acid (AA), methacrylic acid (MAA), esters of AA and MAA, itaconic acid (IA), crotonic acid (CA), acrylamide (AM), methacrylamide (MAM), and derivatives of AM and MAM, e.g., alkyl (meth)acrylamides. Esters of AA and MAA include, but are not limited to, alkyl, hydroxyalkyl, phosphoalkyl and sulfoalkyl esters, e.g., methyl methacrylate (MMA), ethyl methacrylate (EMA), butyl methacrylate (BMA), hydroxyethyl methacrylate (HEMA), hydroxyethyl acrylate (HEA), hydroxypropyl methacrylate (HPMA), hydroxybutyl acrylate (HBA), methyl acrylate (MA), ethyl acrylate (EA), butyl acrylate (BA), 2-ethylhexyl acrylate (EHA), cyclohexyl methacrylate (CHMA), benzyl acrylate (BzA) and phosphoalkyl methacrylates (e.g., PEM). "Styrenic monomers" include styrene, a-methylstyrene; 2-, 3-, or 4-alkylstyrenes, including methyl- and ethyl-styrenes.

The term "vinyl monomers" refers to monomers that contain a carbon-carbon double bond that is connected to a heteroatom such as nitrogen or oxygen. Examples of vinyl monomers include, but are not limited to, vinyl acetate, vinyl formamide, vinyl acetamide, vinyl pyrrolidone, vinyl caprolactam, and long chain vinyl alkanoates such as vinyl neodecanoate, and vinyl stearate.

Preferably, the polymeric particles have a Vicker's scale hardness from 150 to 600 Kgf/mm$^2$, preferably from 200 to 500 Kgf/mm$^2$, preferably from 240 to 400 Kgf/mm$^2$. Vicker's hardness is measured using a standard hardness tester with a diamond tip.

Hardness is determined from $H_v=1.85444(P/d^2)$, where P is the load in kg and d$^2$ is the area of indentation in mm$^2$. Hardness for the particles of this invention was determined using the Shimadzu Micro Compression Testing Machine MCT 500.

Preferably, the polymeric particles are either: (a) particles having $T_g$ from 75 to 150° C.; (b) particles having at least 0.5% polymerized residues of crosslinkers; or a combination thereof. When the particles have a $T_g$ from −50° C. to 75° C., preferably the particles have at least 0.5% residues of crosslinkers, preferably at least 0.75%, preferably at least 1%, preferably at least 1.25%, preferably at least 1.5%, preferably at least 2%, preferably at least 3%, preferably at least 5%. Particles having $T_g$ from 75 to 150° C. may contain the amounts of crosslinker residues described above or may have much lower levels of crosslinker residues. The polymeric particles also may be highly crosslinked and have a high $T_g$, for example, particles formed by polymerization of divinylaromatic monomers (e.g., divinylbenzene), or monomer mixtures having large amounts of divinylaromatic monomers, preferably at least 30%, preferably at least 50%, preferably at least 70%, preferably at least 80%, in combination with other monomers, preferably styrenic or acrylic monomers.

Preferably, the polymeric particles have an average particle diameter of at least 0.8 µm, preferably at least 1 µm, preferably at least 1.5 µm, preferably at least 2 µm, preferably at least 2.5 μm; preferably, these particles have an average particle diameter no greater than 20 μm, preferably no greater than 15 μm, preferably no greater than 12 μm, preferably no greater than 10 μm, preferably no greater than 8 μm, preferably no greater than 6 μm. Preferably, the polymeric particles have a particle size distribution indicating a single mode; preferably the width of the particle size distribution at half-height is from 0.1 to 3 μm, preferably from 0.2 to 1.5 μm. The composition or the film may contain particles having different average diameters provided that particles of each average diameter have a particle size distribution as described immediately above. The particle size distribution is determined using a particle size analyzer. Preferably, the polymeric particles and the film-forming polymer are combined in the form of multistage polymeric particles which have an average particle diameter of at least 1.5 μm, preferably at least 1.8 μm, preferably at least 2 μm, preferably at least 3 μm. Preferably, the multistage polymeric particles have an average particle diameter no greater than 20 μm, preferably no greater than 15 μm, preferably no greater than 12 μm, preferably no greater than 10 μm, preferably no greater than 9 μm, preferably no greater than 8 μm, preferably no greater than 7 μm. Preferably, the multistage polymeric particles are two-stage particles, i.e., at least 70% of the particle has the properties indicated herein for the polymeric particle and film-forming polymer, preferably at least 80%, preferably at least 90%, preferably at least 95%. The particle size distribution is determined using a particle size analyzer.

Preferably, the polymeric particle has $T_g$ from 75 to 150° C. Preferably, the polymeric particle has $T_g$ of at least 80° C., preferably at least 85° C., preferably at least 90° C., preferably at least 95° C. Preferably, the polymeric particle has $T_g$ no greater than 140° C., preferably no greater than 130° C., preferably no greater than 120° C. Preferably, the film-forming polymer or continuous polymeric phase has $T_g$ no greater than 70° C., preferably no greater than 60° C., preferably no greater than 50° C., preferably no greater than 40° C., preferably no greater than 30° C., preferably no greater than 20° C., preferably no greater than 10° C., preferably no greater than 0° C., preferably no greater than –10° C. Preferably, the film-forming polymer or continuous polymeric phase has $T_g$ of at least –50° C., preferably at least –40° C., preferably at least –30° C. Preferably the polymeric particle is one having a radial refractive index gradient ("GRIN" particle, see, e.g., US 20090097123). Preferably, GRIN particles have a refractive index at the center from 1.45 to 1.59, preferably from 1.45 to 1.55, preferably from 1.46 to 1.5; and a refractive index at the surface from 1.57 to 1.63, preferably from 1.58 to 1.62, preferably from 1.58 to 1.61. Preferably, GRIN particles are multistage particles having at least an acrylic first stage. Preferably, the GRIN particles have a second stage having a $T_g$ of at least 80° C., preferably at least 90° C., preferably at least 100° C. Preferably, the second stage comprises polymerized residues of styrenic monomers and/or methyl methacrylate. Preferably, the first stage is from 30 to 95% of the particle, preferably from 50 to 90%, preferably from 65 to 85%. Preferably, each of the first and second stages comprises at least 1% polymerized residues of crosslinkers, preferably at least 2%, preferably at least 3%. There may be other stages containing other monomers located between or on either side of the "first stage" or "second stage," providing that the first stage and second stage collectively comprise at least 80% of the particle, preferably at least 85%, preferably at least 90%, preferably at least 95%.

Refractive index differences stated herein are absolute values. Preferably, the refractive index difference (i.e., the absolute value of the difference) measured from 400 nm to 1100 nm between the polymeric particle and the film-forming polymer, or between the polymeric particle and the continuous polymeric phase is no greater than 0.03, preferably no greater than 0.02, preferably no greater than 0.015, preferably no greater than 0.01. Preferably, the refractive index difference measured below 400 nm and above 1100 nm between the polymeric particle and the film-forming polymer, or between the polymeric particle and the continuous polymeric phase is at least 0.05, preferably at least 0.06, preferably at least 0.07, preferably at least 0.08. Preferably, refractive indices measured above 1100 nm are measured between 1100 nm and 2500 nm, and refractive indices measured below 400 nm are measured between 190 and 400 nm. Preferably, the refractive index of the polymeric particle is from 1.45 to 1.7, preferably from 1.46 to 1.6, preferably from 1.47 to 1.55. Preferably, the refractive index of the film-forming polymer or the continuous polymeric phase is from 1.4 to 1.6, preferably from 1.45 to 1.55, preferably from 1.46 to 1.53. When the polymeric particle is a GRIN particle, its refractive index for purposes of calculating a refractive index difference is the refractive index at the particle surface.

In the composition of this invention, the weight ratio of film-forming polymer to polymeric particles preferably is from 1:3 to 6:1, preferably from 2:3 to 3:1. In the continuous phase in the film, the average distance between the polymeric particles is the center-center distance between the particles. Preferably this distance is from 0.9 to 14 μm, preferably from 2 to 15 μm, preferably from 3 to 10 μm.

Preferably, the film-forming polymer or the continuous polymeric phase comprises at least 60% polymerized residues of acrylic monomers, preferably at least 70%, preferably at least 80%, preferably at least 90%, preferably at least 95%. Preferably, the film-forming polymer or the continuous polymeric phase comprises from 35 to 70% polymerized residues of $C_4$-$C_{12}$ alkyl (meth)acrylate(s), preferably from 40 to 65%, preferably from 45 to 65%. Preferably, the $C_4$-$C_{12}$ alkyl (meth)acrylate(s) are $C_4$-$C_{12}$ alkyl acrylate(s), preferably $C_4$-$C_{10}$ alkyl acrylate(s), preferably BA and/or EHA. Preferably, the film-forming polymer or the continuous polymeric phase also comprises 30 to 65% polymerized residues of $C_1$-$C_4$ alkyl (meth)acrylate(s), preferably from 35 to 60%, preferably from 35 to 55%, and 0 to 5% polymerized residues of acid monomers (e.g., AA, MAA, IA, CA) and may also contain small amounts of residues of vinyl monomers. Preferably, the $C_1$-$C_4$ alkyl (meth)acrylate(s) are $C_1$-$C_2$ alkyl (meth)acrylate(s), preferably MMA and/or EMA.

Preferably, the film-forming polymer or the continuous polymeric phase comprises glycidyl ethers of bisphenol A, novolac resins, triglycidyl ethers of triphenylmethans combined with aminopropyl triethoxysilane.

Preferably, the film-forming polymer combined with a non-aqueous solvent is optically clear, i.e., the film-forming polymer has light transmission from 400-800 nm (measured at a thickness of 150 μm) of at least 50%, preferably at least 75%, preferably at least 95%. Preferably, the polymer is a thermoplastic polymer that does not crystallize under processing or use conditions, i.e., it has a glass-transition temperature higher than about 50° C., and thus is amorphous following incorporation of the polymeric particles of the present invention, and remains amorphous following processing to form the film of the present invention. The polymer typically has an elastic modulus of about 1400 to about 3500 MPa, and may be formed into shaped articles by molding, casting, extrusion or other processes apparent to those skilled in the art. Softer matrix polymers, including polymers capable of plasticization, may also be used, such as poly(vinyl acetate), plasticized vinyl chloride homo- and copolymers, plasticized cellulosic esters and the like. Another preferred class of matrix polymers useful in the present invention are thermoset polymers. The polymers may be thermoset as prepared, e.g., poly(methyl methacrylate) containing sufficient polyfunctional monomer to immobilize the film, or the polymer may be thermoset after polymerization is completed, such as by activating a cure reaction by heating of the polymerized sheet. Examples of such thermosettable matrix polymers include homopolymers of methyl methacrylate, styrene, vinyl chloride and the like, imidized polymers of methyl methacrylate known as polyglutarimides, and copolymers of methyl methacrylate with alkyl acrylates, styrene with up to 40% acrylonitrile, styrene with methyl methacrylate, alpha-methylstyrene with methyl methacrylate and alkyl acrylates and vinyl chloride with vinyl acetate or propylene. Compatible or refractive-index matched blends of the matrix polymers may be used. Preferred matrix polymers are copolymers of methyl methacrylate with 1 to 15% alkyl acrylates wherein the alkyl group contains from 1 to 8 carbon atoms and which also contain a polyfunctional dimethacrylate monomer at the 0.05 to 2% level, or which contain acrylamide and N-methylolacrylamide at the 0.05 to 5% level. The thermoset polymers need not be formed from vinyl monomers, but may be prepared by condensation or ring-opening polymerization, such as by polyesterification in the presence of multifunctional glycols or by epoxide polymerization in the presence of trifunctional epoxides. Examples of such polymers include homopolymers of methyl methacrylate, styrene, vinyl chloride and the like, imidized polymers of methyl methacrylate known as polyglutarimides, and copolymers of methyl methacrylate with alkyl acrylates, styrene with up to 40% acrylonitrile, styrene with methyl methacrylate, alpha-methylstyrene with methyl methacrylate and alkyl acrylates, vinyl chloride with vinyl acetate or propylene, the alkyl group of the alkyl acrylates containing 1 to 8 carbon atoms. Also suitable are homopolymers and copolymers of cellulose acetate butyrate and certain amorphous condensation polymers such as poly(ethylene terephthalate) and poly(cyclohexanedimethanol terephthalate). Preferred matrix polymers are copolymers of methyl methacrylate with from about 1 to about 15% alkyl acrylates wherein the alkyl contains from 1 to 8 carbon atoms.

Preferably, the polymeric particles combined with a non-aqueous solvent have at least 3% polymerized residues of crosslinkers, preferably at least 3.5%, preferably at least 4%, preferably at least 5%, preferably at least 6%.

Preferably, the solvent has a boiling point of at least 35° C., preferably at least 40° C. Preferred solvents include methyl ethyl ketone, methyl isobutyl ketone, ethyl acetate, butyl acetate, toluene, isopropanol, ethyl alcohol and xylene.

Crosslinkers are monomers having two or more ethylenically unsaturated groups, or coupling agents (e.g., silanes) or ionic crosslinkers (e.g., metal oxides). Crosslinkers having two or more ethylenically unsaturated groups may include, e.g., divinylaromatic compounds, di-, tri- and tetra-(meth)acrylate esters, di-, tri- and tetra-allyl ether or ester compounds and allyl (meth)acrylate. Preferred examples of such monomers include divinylbenzene (DVB), trimethylolpropane diallyl ether, tetraallyl pentaerythritol, triallyl pentaerythritol, diallyl pentaerythritol, diallyl phthalate, diallyl maleate, triallyl cyanurate, Bisphenol A diallyl ether, allyl sucroses, methylene bisacrylamide, trimethylolpropane triacrylate, allyl methacrylate (ALMA), ethylene glycol dimethacrylate (EGDMA), hexane-1,6-diol diacrylate (HDDA) and butylene glycol dimethacrylate (BGDMA). Preferably, the amount of polymerized crosslinker residue in the film-forming polymer or the continuous polymeric phase is no more than 0.2%, preferably no more than 0.1%, preferably no more than 0.05%, preferably no more than 0.02%, preferably no more than 0.01%. Preferably, the amount of polymerized crosslinker residue in the polymeric particle having $T_g$ from 75 to 150° C. is no more than 0.5%, preferably no more than 0.3%, preferably no more than 0.2%, preferably no more than 0.1%, preferably no more than 0.05%. Preferably, if crosslinkers are present, they have a molecular weight from 100 to 250, preferably from 110 to 230, preferably from 110 to 200, preferably from 115 to 160. Preferably, crosslinkers are difunctional or trifunctional, i.e., they are diethylenically or triethylenically unsaturated, respectively, preferably difunctional.

Preferably, the composition of this invention is an aqueous emulsion of the polymeric particles of this invention, preferably at a solids level from 35 to 65%, preferably from 40 to 60%; or a dispersion of the polymeric particles in a solvent at the same levels. When the polymeric particles and the film-forming polymer are combined in a multistage particle, preferably the composition is produced from the appropriate monomers by multi-stage emulsion polymerization. Preferably there are two polymerization stages in which different monomer compositions are introduced into the polymerization, although the particles may be made in more stages providing the overall composition is as indicated herein. Preferably, the composition and the film are substantially free of pigments or solid inorganic particles, i.e., they have less than 0.5 wt %, preferably less than 0.2 wt %, preferably less than 0.1 wt %, preferably less than 0.05 wt %.

The film of this invention also may be formed by coating a surface with the polymeric particles and reactive components which will form a continuous polymeric phase surrounding the particles, e.g., two-component polyurethane systems or epoxy-initiator systems.

Compositions of the present invention may take the form of waterborne dispersions, e.g. alkaline, anionic or non-ionic, and may further comprise additives. Preferred additives include, for example, siloxane coupling agents, flow or wetting agents, thickeners and/or rheology modifiers, curing agents, antioxidants, coalescing solvents and plasticizers. Preferably, one or more siloxane coupling agents, such as those having epoxy or amine functionality, are added to improve adhesion to glass and plastics. Particularly preferred siloxane coupling agents include, for example, (3-glycidoxypropyl)trimethoxysilane and N-beta-(aminoethyl)-gamma-aminopropyltrimethoxysilane, which preferably are used in amounts from 0.25 to 5 wt. %, preferably from 0.5 to 3 wt. %, based on the total weight of solid polymer in the composition.

Preferably, the film comprising polymeric particles of the present invention is produced by coating an aqueous emulsion of the polymeric particles of this invention onto a solid substrate and allowing the coating to dry. The film also may be produced by coating a dispersion of polymeric particles in solvent or in a reactive system, as described above. Preferably, the substrate is glass, wood, leather or an optically clear plastic, e.g., poly(ethyleneterephthalate); preferably glass or an optically clear plastic. Preferably, the refractive indices of plastics and glasses for this application vary from a minimum of: 1.4 for (poly(vinylidene)fluoride to 1.8 for glass doped with thallium oxide ($Tl_2O$). Preferably, the wet coating has a thickness from 2 to 30 mils (0.05 to 0.76 mm), preferably from 4 to 20 mils (0.1 to 50 mm), preferably from 6 to 12 mils (0.15 to 0.3 mm). It is believed that the polymeric particles having average diameter from 0.5 to 15 µm associate to produce a matrix of cores in a substantially face-centered cubic or hexagonal close packed arrangement with the outer layer forming the continuous polymeric phase.

EXAMPLES

Example 1

This example describes a coating composition that is formulated with a 5 μm Gradient Refractive Index (GRIN) particle. The materials used are identified in Table 1 below.

TABLE 1

| Materials | grams |
|---|---|
| water | 10 |
| 5 μm GRIN particle (low-high, diffusing particle) | 100 |
| Film forming polymer (aqueous) | 72 |
| thickener/water 1/3 | 8 |
| Butyl cellosolve | 20 |
| butyl carbitol | 1 |
| triethylamine/TERGITOL 15-s-5 mix | 1.6 |
| AQUADERM XL-50 | 10 |
| pH | 7.57 |
| Ford cup #4 | 24' |
| Spray applied over solar panel | 0.72 dry g/sq ft |

Examples 2-7

This example illustrates the preparation of various coatings using the 5 μm GRIN particle, of chemical composition: (80% BA/ALMA=96/4)//20% (MMA/EA=96/4) and the film forming polymer, (80% (EA/AA=96.5/3.5)//20% (MMA), (FFP), referred to as binder. The coating formulation with varying bead loadings were deposited on Mylar film; using 1.5 mil and 3 mils bird applicators and #15 and #25 Dow drawdown bars to give various thicknesses. The test films, derived from the coatings were: 77 mm×56 mm×3 mm in dimension. These samples were evaluated by: ASTM D 10003-00 (Standard test method for haze and luminous transmittance of transparent plastics) and ASTM E 313-00 (Standard practice for calculating yellowness and whiteness indices from instrumentally measured color coordinates). The data are recorded in Table 3. The effect of the coating on the PV cell performance is recorded as PV cell efficiency relative to the uncoated glass substrate, Table 7.

TABLE 2

| | Component | Amount |
|---|---|---|
| EX. 2 | 40:60 Bead:Binder formulation | |
| | 5 μm GRIN spheres | 187.5 gms |
| | FFP | 253.52 gms |
| | ACRYSOL ASE-60 thickener: | 8 gms |
| | Water: | 47.6 gms |
| | Ammonia: | 1.51 gms |
| | Aminosilane (Momentive A1120): | 1.9 gms |
| | Total: | 500.0 gms |
| EX. 3 | 80:20 Bead:Binder formulation | |
| | 5 μm GRIN spheres | 375.00 gms |
| | FFP | 84.51 gms |
| | ACRYSOL ASE-60 thickener: | 5.00 gms |
| | Water: | 35.00 gms |
| | Ammonia: | 1.02 gms |
| | Aminosilane (Momentive A1120): | 1.90 gms |
| | Total: | 502.4 gms |
| EX. 4 | 76:24 Bead:Binder formulation | |
| | Total amount of 80:20 formulation (90%): | 18 gms |
| | Total amount of 40:60 formulation (10%): | 2 gms |
| | Total: | 20 gms |

TABLE 2-continued

| | Component | Amount |
|---|---|---|
| EX. 5 | 70:30 Bead:Binder formulation | |
| | Total amount of 80:20 formulation (75%): | 15 gms |
| | Total amount of 40:60 formulation (25%): | 5 gms |
| | Total: | 20 gms |
| EX. 6 | 60:40 Bead:Binder formulation | |
| | Total amount of 80:20 formulation (50%): | 10 gms |
| | Total amount of 40:60 formulation (50%): | 10 gms |
| | Total: | 20 gms |
| EX. 7 | 50:50 Bead:Binder formulation | |
| | Total amount of 80:20 formulation (25%): | 5 gms |
| | Total amount of 40:60 formulation (75%): | 15 gms |
| | Total: | 20 gms |

TABLE 3

| Ex. | film thickness wet/dry (mils/μm) | L | a | b | haze | $Y_{total}$ | YI | 457 Bright. |
|---|---|---|---|---|---|---|---|---|
| 2 | 12.5/93.5 | 97.90 | 0.02 | 2.78 | 75.45 | 95.85 | 5.09 | 92.12 |
| 2 | 7.5/56.3 | | | | | | | |
| 2 | 3/22.5 | 99.21 | 0.22 | 1.60 | 73.85 | 98.43 | 3.03 | 96.26 |
| 2 | 1.5/11.3 | 98.87 | 0.44 | 1.35 | 72.48 | 97.76 | 2.76 | 95.90 |
| 7 | 12.5/93.5 | 96.47 | −0.25 | 3.50 | 79.06 | 93.06 | 6.30 | 88.44 |
| 7 | 7.5/56.3 | | | | | | | |
| 7 | 3/22.5 | 97.59 | 0.07 | 2.10 | 78.11 | 95.24 | 3.90 | 92.43 |
| 7 | 1.5/11.3 | 97.91 | 0.29 | 1.54 | 77.74 | 95.86 | 3.01 | 93.76 |
| 6 | 12.5/93.5 | 94.19 | −0.22 | 3.60 | 81.32 | 88.73 | 6.65 | 84.09 |
| 6 | 7.5/56.3 | | | | | | | |
| 6 | 3/22.5 | 93.31 | 0.18 | 1.85 | 78.60 | 94.90 | 3.53 | 92.42 |
| 6 | 1.5/11.3 | 96.54 | 0.30 | 2.09 | 78.11 | 93.21 | 4.08 | 90.43 |
| 5 | 12.5/93.5 | 92.30 | −0.37 | 3.96 | 82.72 | 85.20 | 7.38 | 80.18 |
| 5 | 7.5/56.3 | | | | | | | |
| 5 | 3/22.5 | 93.31 | −0.05 | 2.62 | 82.43 | 87.07 | 4.97 | 83.73 |
| 5 | 1.5/11.3 | 92.86 | 0.22 | 2.31 | 82.09 | 86.24 | 4.61 | 83.29 |
| 4 | 12.5/93.5 | 97.33 | −0.18 | 2.87 | 79.04 | 94.72 | 5.13 | 90.91 |
| 4 | 7.5/56.3 | | | | | | | |
| 4 | 3/22.5 | 91.33 | 0.06 | 2.72 | 83.22 | 83.41 | 5.36 | 80.00 |
| 4 | 1.5/11.3 | 91.97 | 0.20 | 2.30 | 82.79 | 84.58 | 4.63 | 81.67 |
| 3 | 12.5/93.5 | 88.84 | −0.45 | 3.79 | 85.05 | 78.93 | 7.26 | 74.32 |
| 3 | 7.5/56.3 | | | | | | | |
| 3 | 3/22.5 | 90.28 | 0.01 | 2.51 | 84.46 | 81.51 | 4.97 | 78.40 |
| 3 | 1.5/11.3 | 88.94 | 0.10 | 2.65 | 84.79 | 79.10 | 5.40 | 75.87 |

Examples 8-13

These examples illustrate the preparation of various coating compositions from 5 μm GRIN particles, of chemical composition: (80% BzA/ALMA=96/4)//20% (MMA/EA=96/4) (BZA) and the binder film forming polymer, FFP. The coating formulation with varying bead loadings were deposited on Mylar film; using 1.5 mil and 3 mils bird applicators and #15 and #25 Dow drawdown bars to give various thicknesses. The test films, derived from the coatings were: 77 mm×56 mm×3 mm in dimension. These samples were evaluated by: ASTM D 10003-00 (Standard test method for haze and luminous transmittance of transparent plastics) and ASTM E 313-00 (Standard practice for calculating yellowness and whiteness indices from instrumentally measured color coordinates). The data are recorded in Table 4.

The effect of the coating on the PV cell performance is recorded as PV cell efficiency relative to the uncoated glass substrate, Table 7.

TABLE 4

| Ex. | Formulation | Amount |
|---|---|---|
| 8 | 76:24 Bead:Binder formulation | |
| | Total amount of 80:20 formulation (90%): | 18 g |
| | Total amount of 40:60 formulation (10%): | 2 g |
| | Total: | 20 g |
| 9 | 70:30 Bead:Binder formulation | |
| | Total amount of 80:20 formulation (75%): | 15 g |
| | Total amount of 40:60 formulation (25%): | 5 g |
| | Total: | 20 g |
| 10 | 60:40 Bead:Binder formulation | |
| | Total amount of 80:20 formulation (50%): | 10 g |
| | Total amount of 40:60 formulation (50%): | 10 g |
| | Total: | 20 g |
| 11 | 50:50 Bead:Binder formulation | |
| | Total amount of 80:20 formulation (25%): | 5 g |
| | Total amount of 40:60 formulation (75%): | 15 g |
| | Total: | 20 g |
| | Component | |
| 12 | 40:60 Bead:Binder formulation | |
| | Bead (BZA): | 166.67 g |
| | Binder FFP | 253.52 g |
| | ACRYSOL ASE-60 thickener: | 8 g |
| | Water: | 47.6 g |
| | Ammonia: | 1.51 g |
| | Aminosilane (Momentive A1120): | 1.9 g |
| | Total: | 479.2 g |
| 13 | 80:20 Bead:Binder formulation | |
| | Bead (BZA): | 375.00 g |
| | Binder FFP | 84.51 g |
| | ACRYSOL ASE-60 thickener: | 5.00 g |
| | Water: | 35.00 g |
| | Ammonia: | 1.02 g |
| | Aminosilane (Momentive A1120): | 1.90 g |
| | Total: | 502.4 g |

TABLE 5

| Ex. | film thickness wet/dry (mils/μm) | L | a | b | haze | $Y_{total}$ | YI | 457 Bright. |
|---|---|---|---|---|---|---|---|---|
| 12 | 12.5/93.5 | 92.89 | 0.35 | 4.13 | 86.60 | 86.28 | 8.21 | 81.00 |
| 12 | 7.5/56.3 | | | | | | | |
| 12 | 3/22.5 | 95.99 | 0.71 | 2.09 | 87.24 | 92.13 | 4.41 | 89.34 |
| 12 | 1.5/11.3 | 100.03 | 0.42 | 1.90 | 84.89 | 100.05 | 3.69 | 97.43 |
| 11 | 12.5/93.5 | 89.44 | 0.37 | 4.33 | 86.68 | 80.00 | 8.94 | 74.68 |
| 11 | 7.5/56.3 | | | | | | | |
| 11 | 3/22.5 | 95.67 | 0.40 | 3.21 | 85.95 | 91.53 | 6.29 | 87.30 |
| 11 | 1.5/11.3 | 98.62 | 0.40 | 2.16 | 85.19 | 97.26 | 4.19 | 94.32 |
| 10 | 12.5/93.5 | 87.67 | 0.45 | 3.80 | 89.34 | 76.86 | 8.11 | 72.27 |
| 10 | 7.5/56.3 | 93.16 | 0.40 | 3.88 | 86.32 | 86.79 | 7.73 | 81.81 |
| 10 | 3/22.5 | 96.26 | 0.39 | 2.77 | 85.86 | 92.67 | 5.43 | 88.99 |
| 10 | 1.5/11.3 | 94.88 | 0.40 | 2.70 | 85.56 | 90.02 | 5.38 | 86.49 |
| 9 | 12.5/93.5 | 89.60 | 0.35 | 3.86 | 86.59 | 80.29 | 7.97 | 75.53 |
| 9 | 7.5/56.3 | | | | | | | |
| 9 | 3/22.5 | 94.04 | 0.37 | 2.95 | 85.79 | 88.44 | 5.89 | 84.62 |
| 9 | 1.5/11.3 | 95.35 | 0.40 | 2.62 | 85.28 | 90.92 | 5.21 | 87.47 |
| 8 | 12.5/93.5 | 89.13 | 0.36 | 4026.00 | 86.59 | 79.44 | 8.82 | 74.22 |
| 8 | 7.5/56.3 | | | | | | | |
| 8 | 3/22.5 | 94.23 | 0.37 | 2.81 | 85.70 | 88.80 | 5.61 | 85.15 |
| 8 | 1.5/11.3 | 94.06 | 0.38 | 1.80 | 85.03 | 88.48 | 3.71 | 86.14 |
| 13 | 12.5/93.5 | 89.99 | 0.26 | 3.44 | 86.49 | 80.99 | 7.03 | 76.74 |
| 13 | 7.5/56.3 | | | | | | | |
| 13 | 3/22.5 | 92.44 | 0.32 | 2.21 | 85.75 | 85.46 | 4.52 | 82.65 |
| 13 | 1.5/11.3 | 93.89 | 0.66 | 1.58 | 85.16 | 88.15 | 3.51 | 86.07 |

Examples 14-19

These examples illustrate the preparation of various coating compositions from 5.11 μm particles, of chemical composition: (77% MMA/DVB=77/23) (LTL-4603) and the binder, film forming polymer. The coating formulation with varying bead loadings were deposited on Mylar film; using 1.5 mil and 3 mils bird applicators and #15 and #25 Dow drawdown bars to give various thicknesses. The test films, derived from the coatings were: 77 mm×56 mm×3 mm in dimension. These samples were evaluated by: ASTM D 10003-00 (Standard test method for haze and luminous transmittance of transparent plastics) and ASTM E 313-00 (Standard practice for calculating yellowness and whiteness indices from instrumentally measured color coordinates). The data are recorded in Table 4. The effect of the coating on the PV cell performance is recorded as PV cell efficiency relative to the uncoated glass substrate, Table 7.

TABLE 6

| | Component | Amount |
|---|---|---|
| Ex. 16 | 76:24 Bead:Binder formulation | |
| | Total amount of 80:20 formulation (90%): | 18 g |
| | Total amount of 40:60 formulation (10%): | 2 g |
| | Total: | 20 g |
| Ex. 17 | 70:30 Bead:Binder formulation | |
| | Total amount of 80:20 formulation (75%): | 15 g |
| | Total amount of 40:60 formulation (25%): | 5 g |
| | Total: | 20 g |
| Ex. 18 | 60:40 Bead:Binder formulation | |
| | Total amount of 80:20 formulation (50%): | 10 g |
| | Total amount of 40:60 formulation (50%): | 10 g |
| | Total: | 20 g |
| Ex. 19 | 50:50 Bead:Binder formulation | |
| | Total amount of 80:20 formulation (25%): | 5 g |
| | Total amount of 40:60 formulation (75%): | 15 g |
| | Total: | 20 g |

TABLE 6-continued

| | Component | Amount |
|---|---|---|
| Ex. 14 | 40:60 Bead:Binder formulation | |
| | Bead (LTL4603): | 159.15 g |
| | Binder FFP | 253.52 g |
| | ACRYSOL ASE-60 thickener: | 8 g |
| | Water: | 47.6 g |
| | Ammonia: | 1.51 g |
| | Aminosilane (Momentive A1120): | 1.9 g |
| | Total: | 471.7 g |
| Ex. 15 | 80:20 Bead:Binder formulation | |
| | Bead (LTL4603): | 318.30 g |
| | Binder FFP | 84.51 g |
| | ACRYSOL ASE-60 thickener: | 5.00 g |
| | Water: | 35.00 g |
| | Ammonia: | 1.02 g |
| | Aminosilane (Momentive A1120): | 1.90 g |
| | Total: | 445.7 g |

TABLE 7

| SAMPLES @ 90° ANGLE | EFFICIENCY % | Reflectance @ 400 nm | Reflectance @ 700 nm |
|---|---|---|---|
| FFP, 10 MIC AVG: | −8.23 | 65.10 | 79.92 |
| FFP, 20 MIC AVG. | −12.29 | 64.87 | 79.59 |
| FFP, 30 MIC AVG | −13.18 | 64.84 | 79.47 |
| EX. 2, 10 MIC AVG: | 2.30 | 54.26 | 64.85 |
| EX. 2, 20 MIC AVG: | 2.15 | 54.56 | 65.07 |
| EX. 2, 30 MIC AVG: | 1.93 | 54.35 | 65.87 |
| EX. 7, 10 MIC AVG: | 2.47 | 53.27 | 64.08 |
| EX. 7, 20 MIC AVG: | 2.85 | 50.48 | 60.16 |
| EX. 7, 30 MIC AVG: | 3.08 | 51.75 | 63.45 |
| EX. 6, 10 MIC AVG: | 4.21 | 51.49 | 62.05 |
| EX. 6, 20 MIC AVG: | 4.31 | 51.88 | 62.42 |
| EX. 6, 30 MIC AVG: | 4.45 | 51.62 | 62.42 |
| EX. 3, 10 MIC AVG: | 4.34 | 49.16 | 58.11 |
| EX. 3, 20 MIC AVG: | 2.07 | 48.31 | 56.76 |
| EX. 3, 30 MIC AVG: | 0.07 | 48.05 | 55.67 |
| EX. 12, 10 MIC AVG: | NM | 52.62 | 62.68 |
| EX. 12, 20 MIC AVG: | NM | 52.75 | 63.71 |
| EX. 12, 30 MIC AVG: | NM | 48.94 | 60.31 |
| EX. 11, 10 MIC AVG: | NM | 49.29 | 60.35 |
| EX. 11, 20 MIC AVG: | 2.41 | 49.60 | 55.63 |

TABLE 8

The refractive index of beads and the binder, Film Forming Polymer (FFP)

| Examples | Composition | Refractive Index |
|---|---|---|
| FFP | (80% (EA/AA = 96.5/3.5)//20% (MMA) | 1.4729 |
| EX. 2 | (80% (BA/ALMA = 96/4))//20% (MMA/EA = 96/4) | 1.46//1.49 |
| EX. 8 | (80% BzA/ALMA = 96/4)//20% (MMA/EA = 96/4) | 1.56//1.49 |
| EX. 14 | (77% (MMA/DVB = 77/23)) | 1.5182 |

The invention claimed is:

1. A composition comprising polymeric particles having a unimodal particle size distribution and having: (a) an average particle diameter from 2.5 to 30 μm; and (b) a Vicker's scale hardness from 100 to 700 Kgf/mm$^2$; and a film-forming polymer having $T_g$ no greater than 80° C.;wherein an average refractive index difference measured from 400 nm to 1100 nm between the polymeric particles and the film-forming polymer is no greater than 0.04, and an average refractive index difference measured above 1100 nm or below 400 nm between the polymeric particles and the film-forming polymer is at least 0.04; and wherein the particles have a radial refractive index gradient.

2. The composition of claim 1 in which the average refractive index difference measured from 400 nm to 1100 nm between the polymeric particles and the film-forming polymer is no greater than 0.03.

3. The composition of claim 2 in which the average particle diameter is from 2.5 to 10 μm.

4. The composition of claim 3 in which the polymeric particles have a refractive index gradient from 1.46 to 1.6.

5. A film comprising polymeric particles having a unimodal particle size distribution and having: (a) an average particle diameter from 2.5 to 30 μm; and (b) a Vicker's scale hardness from 100 to 700 Kgf/mm$^2$; and a continuous polymeric phase having $T_g$ no greater than 80° C.; wherein an average refractive index difference measured from 400 nm to 1100 nm between the polymeric particles and the continuous polymeric phase is no greater than 0.04, and an average refractive index difference measured above 1100 nm or below 400 nm between the polymeric particles and the continuous polymeric phase is at least 0.04; and wherein an average distance between the polymeric particles is from 0.85 to 30 μm; and wherein the particles have a radial refractive index gradient.

6. The film of claim 5 in which the average refractive index difference measured from 400 nm to 1100 nm between the polymeric particles and the continuous polymeric phase is no greater than 0.03.

7. The film of claim 6 in which the average particle diameter is from 2.5 to 10 μm.

8. The film of claim 7 in which the polymeric particles have a refractive index from 1.46 to 1.6.

9. A composition comprising: (a) polymeric particles having a unimodal particle size distribution and having (i) an average particle diameter from 2.5 to 30μm,(ii) a Vicker's scale hardness from 100 to 700 Kgf/mm$^2$, and (iii) at least 2.5 wt% polymerized residues of crosslinkers; (b) a non-aqueous solvent having a boiling point no greater than 140° C.; and (c) a film-forming polymer; wherein an average refractive index difference measured from 400 nm to 1100 nm between the polymeric particles and the film-forming polymer is no greater than 0.04, and an average refractive index difference measured above 1100 nm or below 400 nm between the polymeric particles and the film-forming polymer is at least 0.04; and wherein the particles have a radial refractive index gradient.

10. The composition of claim 9 in which the average refractive index difference measured from 400 nm to 1100 nm between the polymeric particles and the film-forming polymer is no greater than 0.03; the average particle diameter is from 2.5 to 10 μm; and the polymeric particles have a refractive index gradient from 1.46 to 1.6.

* * * * *